United States Patent
Yoo et al.

(10) Patent No.: US 10,074,827 B2
(45) Date of Patent: Sep. 11, 2018

(54) ENCAPSULATION FILM

(71) Applicant: LG CHEM, LTD., Seoul (KR)

(72) Inventors: Hyun Jee Yoo, Daejeon (KR); Hyun Suk Kim, Daejeon (KR); Jung Ok Moon, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/308,800

(22) PCT Filed: Feb. 4, 2016

(86) PCT No.: PCT/KR2016/001271
§ 371 (c)(1),
(2) Date: Nov. 3, 2016

(87) PCT Pub. No.: WO2016/126131
PCT Pub. Date: Aug. 11, 2016

(65) Prior Publication Data
US 2017/0186997 A1    Jun. 29, 2017

(30) Foreign Application Priority Data
Feb. 4, 2015    (KR) ........................ 10-2015-0017620

(51) Int. Cl.
| H01L 23/28 | (2006.01) |
| C09J 7/38 | (2018.01) |
| C09J 123/22 | (2006.01) |
| H01L 51/52 | (2006.01) |
| H01L 51/00 | (2006.01) |
(Continued)

(52) U.S. Cl.
CPC .......... *H01L 51/5253* (2013.01); *C09J 7/381* (2018.01); *C09J 123/22* (2013.01); *H01L 23/3135* (2013.01); *H01L 51/004* (2013.01); *H01L 51/107* (2013.01); *H01L 51/448* (2013.01); *H01L 51/5259* (2013.01); *C09J 2201/36* (2013.01); *C09J 2201/606* (2013.01); *C09J 2201/622* (2013.01); *C09J 2203/326* (2013.01); *C09J 2423/00* (2013.01); *H01L 23/28* (2013.01)

(58) Field of Classification Search
None
See application file for complete search history.

(56) References Cited

U.S. PATENT DOCUMENTS

| 2002/0169233 A1 | 11/2002 | Schwantes |
| 2011/0105637 A1 | 5/2011 | Fujita et al. |
(Continued)

FOREIGN PATENT DOCUMENTS

| CN | 1616542 A | 5/2005 |
| CN | 101370889 A | 2/2009 |
(Continued)

*Primary Examiner* — Frank D Ducheneaux
(74) *Attorney, Agent, or Firm* — Dentons US LLP

(57) ABSTRACT

Provided are an encapsulation film, an organic electronic device including the same, and a method of manufacturing the organic electronic device. Therefore, provided is the pressure-sensitive adhesive composition, which can form a structure capable of effectively blocking moisture or water entering the organic electronic device from the outside, and have excellent processability in a process of manufacturing a panel and excellent heat retention under a high-temperature and high-humidity condition.

21 Claims, 1 Drawing Sheet

(51) Int. Cl.
*H01L 51/44* (2006.01)
*H01L 51/10* (2006.01)
*H01L 23/31* (2006.01)

(56) References Cited

U.S. PATENT DOCUMENTS

| | | | |
|---|---|---|---|
| 2012/0118469 A1 | 5/2012 | Joly et al. | |
| 2014/0217621 A1* | 8/2014 | Yoo .......................... | B32B 3/04 257/788 |
| 2014/0243444 A1 | 8/2014 | Ikari et al. | |
| 2015/0357570 A1 | 12/2015 | Lee et al. | |

FOREIGN PATENT DOCUMENTS

| | | |
|---|---|---|
| CN | 102083930 A | 6/2011 |
| CN | 101705067 B | 1/2012 |
| CN | 102576821 A | 7/2012 |
| CN | 102898956 A | 1/2013 |
| CN | 103946998 A | 7/2014 |
| CN | 103998238 A | 8/2014 |
| CN | 104350119 A | 2/2015 |
| JP | 2012-0238768 A | 12/2012 |
| JP | 2013-241542 A | 12/2013 |
| KR | 1020080088606 A | 10/2008 |
| KR | 10-2011-0014692 A | 2/2011 |
| KR | 1020130135142 A | 12/2013 |
| KR | 1020140082579 A | 7/2014 |
| KR | 10-2014-0136900 A | 12/2014 |
| KR | 1020140136902 A | 12/2014 |
| KR | 1020150010667 A | 1/2015 |
| TW | 201005059 A1 | 2/2010 |
| TW | 201305302 A1 | 2/2013 |
| TW | 201446843 A | 12/2014 |
| WO | 2007/087281 A1 | 8/2007 |
| WO | 2009/148722 A2 | 12/2009 |
| WO | 2012/003417 A1 | 1/2012 |
| WO | 2013013568 A1 | 1/2013 |
| WO | WO 2013/103283 A1 * | 7/2013 ................ C09J 7/02 |

* cited by examiner

ENCAPSULATION FILM

CROSS-REFERENCE TO RELATED APPLICATION

This application is a National Stage Entry of International Application No. PCT/KR2016/001271, filed Feb. 4, 2016, and claims the benefit of and priority to Korean Application No. 10-2015-0017620, filed on Feb. 4, 2015, all of which are hereby incorporated by reference in their entirety for all purposes as if fully set forth herein.

BACKGROUND

1. Field of the Invention

The present application relates to an encapsulation film, an organic electronic device (OED) including the same, and a method of manufacturing an OED using the same.

2. Discussion of Related Art

An OED is a device including an organic material layer in which electric charges are exchanged using holes and electrons, and the OED may be, for example, a photovoltaic device, a rectifier, a transmitter, or an organic light emitting diode (OLED).

Among the OLEDs, an OLED has a lower power consumption and a higher response speed, and is advantageous to a thinner display device or lighting than a conventional light source. Such an OLED also has excellent space applicability, and is expected to be applied to various fields including all kinds of portable devices, monitors, notebook computers and TVs.

For commercialization and expanded use of the OLED, the most critical problem is durability. Organic materials and metal electrodes included in the OLED are very easily oxidized by an external factor, for example, moisture. Therefore, a product including an OLED is very sensitive to environmental factors. For this reason, various methods have been suggested to effectively prevent the permeation of oxygen or moisture into an OED such as an OLED from the outside.

In Patent Document 1, an adhesive capsulation composition film and an organic electroluminescent element are disclosed, and the composition is a polyisobutylene (PIB)-based pressure-sensitive adhesive, but has low processability and low reliability under a high-temperature and high-humidity condition. In addition, in a process of laminating large-scale flat panels, air bubbles are enclosed between the panels, and therefore a uniform laminating property may not be obtained.

Therefore, there is a demand for developing an encapsulant, which allows an OED to ensure a demanded lifespan, effectively prevents the permeation of moisture into the OED, maintains reliability under a high-temperature and high-humidity condition, and has an excellent laminating property, which is one of the characteristics required during a process of manufacturing a panel.

PRIOR ART

Patent Document (Patent Document 1) Korean Unexamined Patent Application Publication No. 2008-0088606

SUMMARY OF THE INVENTION

The present application provides an encapsulation film, which can form a structure capable of effectively blocking moisture or oxygen entering an OED from the outside, have excellent processability during a process of manufacturing a panel and excellent heat retention under a high-temperature and high-humidity condition.

Hereinafter, with reference to the accompanying drawings, exemplary embodiments of the present application will be described in further detail. In addition, to explain the present application, detailed descriptions for known general functions or configurations will be omitted. In addition, the accompanying drawings are schematically provided to help in understanding the present application. To more clearly explain the present application, parts not relating to the explanation will be omitted, thicknesses are exaggerated to clearly express several layers and regions. The scope of the present application is not limited by thicknesses, sizes, and ratios shown in the drawings.

The present application relates to an encapsulation film. The encapsulation film may be applied to encapsulate or capsulate an OED such as an OLED.

The term "organic electronic device (OED)" used herein is a product or device having a structure including an organic material layer in which electric charges are exchanged using holes and electrons between a pair of electrodes facing each other, and examples of the OED may include, but the present application is not limited to, a photovoltaic device, a rectifier, a transmitter, and an OLED. In an exemplary embodiment of the present application, the OED may be an OLED.

The encapsulation film of the present application may seal the entire surfaces of an organic electronic element of the OED to protect the element from moisture or oxygen. Such an encapsulation film may include a metal layer and a pressure-sensitive adhesive layer. The pressure-sensitive adhesive layer may include a first layer having an elastic portion calculated by General Equation 1 of 30 to 80%, and the second layer having an elastic portion calculated by General Equation 1 of 8 to 40%.

$$Ep(\text{unit: \%}) = 100 \times \sigma2/\sigma1 \qquad \text{[General Equation 1]}$$

In General Equation 1, σ1 is the maximum stress value measured when 30% of stain is applied to the film by applying a normal force of about 200 gf at 85° C. using a parallel plate having a diameter of 8 mm in a stress relaxation test mode of an advanced rheometric expansion system (ARES) while the pressure-sensitive adhesive layer is formed to a thickness of 600 μm, and σ2 is a stress value measured after the state in which the strain is applied to the film is maintained for 180 seconds. Specifically, the pressure-sensitive adhesive layer is first formed to a thickness of 600 μm, and a stress relaxation test mode of the advanced rheometric expansion system (ARES) is used. Here, a normal force of about 200 gf is applied at 85° C. using a parallel plate having a diameter of 8 mm. σ1 is the maximum stress value measured when 30% of strain is applied to the film, and σ2 is a stress value measured after the state in which the strain is applied to the film is maintained for 180 seconds.

As described above, the encapsulation film may be applied to encapsulate or capsulate the OED such as an OLED. The encapsulation film exhibiting the value (Ep) range may be formed in an encapsulating or capsulating structure with excellent durability without generating air bubbles under a high temperature durability test condition when applied to an encapsulation or capsulation process. In an exemplary embodiment, the encapsulation film may be used, as will be described later, to form the encapsulating or capsulating structure covering the top and side surfaces of an element of the OED.

The term "advanced rheometric expansion system (ARES)" is a rheometer evaluating viscoelastic properties such as viscosity, shear modulus, loss factor and storage modulus of a material. The instrument is a mechanical measuring device that can apply dynamic and normal states to a sample and measure a transfer torque to an extent that the sample is resistant to the stress applied as described above.

In an exemplary embodiment, the encapsulation film of the present application may be directly attached to a metal layer on the first layer of the pressure-sensitive adhesive layer. The term "directly attached" used herein may mean that there is no layer between two layers. Also, the second layer may be attached to a substrate on which an element is formed to entirely seal the element. That is, the second layer may be directly attached to the substrate.

In an exemplary embodiment, the value Ep calculated by General Equation 1 as described above of the first layer of the exemplary encapsulation film may be 30 to 80%, 30 to 75% or 30 to 70%. Also, the value Ep calculated by General Equation 1 as described above of the second layer may be 8 to 40%, 10 to 40% or 20 to 40%. In the present application, the adhesive durability and reliability of the first layer may be excellently maintained by controlling the Ep value within the above range by considering that the first layer is directly attached to the metal layer. Also, in the present application, the lamination quality between the substrate and the encapsulation film of the second layer may be achieved by controlling the Ep value within the above range. The value of the elastic portion of the first layer according to the present application may be the same as or higher than the value of the elastic portion of the second layer, but the present application is not limited thereto.

In an exemplary embodiment of the present application, the first layer may have a probe tack force measured according to ASTM D2979 within a range of 50 to 500 gf, and specifically, the first layer may have a probe tack force of 60 to 450 gf or 70 to 400 gf. Also, the second layer may have a probe tack force measured according to ASTM D2979 within a range of 3 to 100 gf, and specifically, the second layer may have a probe tack force of 3 to 90 gf.

In an exemplary embodiment of the present application, the pressure-sensitive adhesive layer may satisfy General Equation 2.

$$d \leq 1 \text{ mm} \quad \text{[General Equation 2]}$$

In General Equation 2, d is a distance of the pressure-sensitive adhesive layer creeped behind when a sample prepared by forming the pressure-sensitive adhesive layer having a thickness of 50 μm on one surface of a metal base is attached to a glass in an adhesive area of 1 cm×1 cm, and 500 g of a weight is loaded to the metal base at 85° C. for 1 hour in a gravity direction. In the measurement above, a layer which is attached to the glass may be the first layer or the second layer, but not limited thereto. Here, the metal base may be formed of copper, aluminum, nickel, invar or stainless steel (SUS). In detail, the surface of the pressure-sensitive adhesive layer of the laminate sample including the pressure-sensitive adhesive layer and the metal base may be attached to the glass in an area of 1 cm×1 cm, and a weight may be loaded to the metal base as described above. The creeping distance of the pressure-sensitive adhesive layer may be measured in a distance of the movement of the metal base. In General Equation 2, d may be 1 mm or less, for example, 990 μm or less, 950 μm or less, 800 μm or less, 700 μm or less, 600 μm or less, or 400 μm or less.

A pressure-sensitive adhesive composition constituting the pressure-sensitive adhesive layer may include a polymer derived from butylene, and additionally include a compound satisfying Formula 1. The compound of Formula 1 may include a monofunctional acrylate. Pressure-sensitive adhesive compositions constituting a first layer and a second layer may be the same as or different from each other, and a composition for the pressure-sensitive adhesive layer described below may be applied to manufacture both of the first layer and the second layer.

In the exemplary embodiment of the present application, the pressure-sensitive adhesive composition may include a polymer derived from butylene and a compound satisfying Formula 1.

[Formula 1]

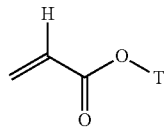

In Formula 1, T may be a linear or branched alkyl group, alkenyl group or alkynyl group. The alkyl group, alkenyl group or alkynyl group may have a linear or branched structure having 6 to 30, 7 to 25, 8 to 23, 9 to 20, 10 to 19, 6 to 17 or 6 to 11 carbon atoms. Also, T may be —U[O—W]$_n$—O-Q. Here, U and W are each independently an alkylene group or alkylidene group, and Q is an alkyl group, alkenyl group, alkynyl group or aryl group. Also, n is a number from 0 to 10, and when n is 0, U may be directly linked to —O-Q. Since the pressure-sensitive adhesive composition of the present application includes both of a hydrophobic polymer and the specific compound of Formula 1, when applied to encapsulation of the organic electronic element, the composition can exhibit excellent processability during the process of manufacturing a panel and excellent heat retention under a high-temperature and high-humidity condition.

In an exemplary embodiment, the composition may include 60 to 95 parts by weight of the polymer derived from butylene and 5 to 40 parts by weight of the compound satisfying Formula 1. In an exemplary embodiment, the composition may include 60 to 90 parts by weight of the polymer derived from butylene and 10 to 40 parts by weight of the compound satisfying Formula 1, or 65 to 90 parts by weight of the polymer derived from butylene and 10 to 35 parts by weight of the compound satisfying Formula 1. In the present application, as the contents of the components are adjusted in the above-described ranges, an excellent moisture blocking property and heat retention under a high-temperature and high-humidity condition may be realized. The compound of Formula 1 may include, but is not particularly limited to, n-octyl acrylate, iso-octyl acrylate, iso-nonyl acrylate, lauryl acrylate, stearyl acrylate, isostearyl acrylate, isodecyl acrylate, 2-(2-ethoxyethoxy)ethyl acrylate, methoxytriethyleneglycol acrylate, or methoxypolyethyleneglycol acrylate.

The term "alkyl group" used herein may be, unless particularly defined otherwise, an alkyl group having 1 to 30, 1 to 25, 1 to 20, 1 to 16, 1 to 12, 1 to 8, or 1 to 4 carbon atoms. The alkyl group may have a linear, branched or cyclic structure, and may be arbitrarily substituted with at least one substituent.

Also, the term "alkenyl group" or "alkynyl group" used herein may be, unless particularly defined otherwise, an alkenyl or alkynyl group having 2 to 20, 2 to 16, 2 to 12, 2 to 8, or 2 to 4 carbon atoms. The alkenyl or alkynyl group may be linear, branched or cyclic. Also, the alkenyl group may be arbitrarily substituted with at least one substituent.

Also, the term "alkylene group" or "alkylidene group" used herein may be, unless particularly defined otherwise, an alkylene or alkylidene group having 2 to 30, 2 to 25, 2 to 20, 2 to 16, 2 to 12, 2 to 10, or 2 to 8 carbon groups. The alkylene group or an alkylidene group may be linear, branched or cyclic. Also, the alkylene or alkylidene group may be arbitrarily substituted with at least one substituent.

The term "aryl group" used herein may be, unless particularly defined otherwise, a monovalent residue derived from a compound including a structure in which benzene is included, or two or more benzenes are condensed or coupled or a derivative thereof. The aryl group may have 6 to 22, preferably 6 to 16, and more preferably 6 to 13 carbon atoms, and may be, for example, a phenyl group, a phenylethyl group, a phenylpropyl group, a benzyl group, a tolyl group, a xylyl group or a naphthyl group.

The term "polymer derived from butylene" may mean that one or more polymerization units of the polymer are derived from butylene. Since the polymer derived from butylene has a very low polarity, is transparent and almost has no influence of corrosion, when used as an encapsulant or sealant, the polymer may exhibit an excellent moisture blocking property and excellent durability and reliability.

In the present application, also, the polymer derived from butylene may be a homopolymer of a butylene monomer; a copolymer formed by copolymerizing a butylene monomer with a different polymerizable monomer; a reactive oligomer using a butylene monomer; or a mixture thereof. The polymer derived in the present application refers that a polymer is formed with a unit of polymerized monomers. The butylene monomer may include, for example, 1-butene, 2-butene or isobutylene.

The butylene monomer or the different monomer capable of being polymerized with a derivative may include, for example, isoprene, styrene or butadiene. When the copolymer is used, physical properties such as processability and a crosslinking degree may be maintained, and therefore, when applied to the OED, thermal resistance of the pressure-sensitive adhesive itself may be ensured.

Also, the reactive oligomer using a butylene monomer may include a butylene polymer having a reactive functional group. The oligomer may have a weight average molecular weight of 500 to 5000. Also, the butylene polymer may be linked to a different polymer having a reactive functional group. The different polymer may be an alkyl (meth)acrylate, but the present application is not limited thereto. The reactive functional group may be a hydroxyl group, a carboxyl group, an isocyanate group or a nitrogen-containing group. Also, the reactive oligomer and the different polymer may be crosslinked by a multifunctional crosslinking agent, which may be one or more selected from the group consisting of an isocyanate crosslinking agent, an epoxy crosslinking agent, an aziridine crosslinking agent and a metal chelate crosslinking agent.

In an exemplary embodiment, the polymer derived from butylene of the present application may be a copolymer of diene and an olefin-based compound including one carbon-carbon double bond. Here, the olefin-based compound may include butylene, and the diene may be a monomer capable of being polymerized with the olefin-based compound, for example, isoprene or butadiene. For example, the copolymer of the olefin-based compound including a carbon-carbon double bond and diene may be butyl rubber.

In the present application, the polymer may have a certain weight average molecular weight (MW) so that a pressure-sensitive adhesive composition can be molded in a film shape. For example, the polymer may have a weight average molecular weight of about 10,000 to 2,000,000, 10,000 to 1,000,000, 10,000 to 500,000 or 10,000 to 300,000. In the present application, the term "weight average molecular weight" is a value converted with respect to standard polystyrene measured by gel permeation chromatography (GPC). However, the above-described weight average molecular weight does not necessarily have a resin component. For example, even when the molecular weight of the resin component is not enough to form a film, a separate binder resin may be blended in the pressure-sensitive adhesive composition. The terms "polymer" and "resin component" may have the same meaning as each other.

In an exemplary embodiment of the present application, the pressure-sensitive adhesive layer may further include a multifunctional active energy ray polymerizable compound, which can be polymerized by irradiation with an active energy ray. The active energy ray polymerizable compound may satisfy Formula 2.

[Formula 2]

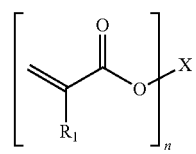

In Formula 2, $R_1$ is hydrogen or an alkyl group having 1 to 4 carbon atoms, n is an integer of 2 or higher, and X is a residue derived from a linear, branched or cyclic alkyl group having 3 to 30 carbon atoms.

The active energy ray polymerizable compound satisfying Formula 2 particularly has an excellent compatibility with the polymer of the present application, and therefore can satisfy reliability under a high-temperature and high-humidity condition. For example, the active energy ray polymerizable compound may realize a pressure-sensitive adhesive composition having an excellent moisture blocking property and excellent reliability under a high-temperature and high-humidity condition, along with the above-described polymer derived from butylene.

The active energy ray polymerizable compound may refer to a compound including two or more functional groups capable of participating in a polymerization reaction by irradiation with an active energy ray, for example, functional groups including an ethylene-like unsaturated double bond such as an acryloyl or methacryloyl group, and functional groups such as an epoxy or oxetane group.

As described above, the active energy ray polymerizable compound may satisfy Formula 2.

[Formula 2]

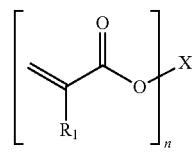

In Formula 2, $R_1$ is hydrogen or an alkyl group having 1 to 4 carbon atoms, n is an integer of 2 or higher, and X is a residue derived from a linear, branched or cyclic alkyl group having 3 to 30 carbon atoms. Here, when X is a residue derived from a cyclic alkyl group, X may be a residue derived from a cyclic alkyl group having 3 to 30, 6 to 28, 8 to 22, or 12 to 20 carbon atoms. Also, when X is a residue derived from a linear alkyl group, X may be a residue derived from a linear alkyl group having 3 to 30, 6 to 25, or 8 to 20 carbon atoms. Also, when X is a residue derived from a branched alkyl group, X may be a residue derived from a branched alkyl group having 3 to 30, 5 to 25, or 6 to 20 carbon atoms.

The term "residue derived from an alkyl group" used herein may refer to a residue of a specific compound, for example, an alkyl group. In an exemplary embodiment, in Formula 2, when n is 2, X may be an alkylene group. Also, when n is 3 or higher, two or more hydrogens are released from an alkyl group of X, and may be bound to a (meth) acryloyl group of Formula 2.

The multifunctional active energy ray polymerizable compound capable of being polymerized by the radiation of an active energy ray may be used without limitation as long as satisfying Formula 2. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentyl glycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentyl glycol-modified trimethylpropane di(meth)acrylate, adamantane di(meth)acrylate, trimethylolpropane tri(meth)acrylate, or a mixture thereof.

As the multifunctional active energy ray polymerizable compound, for example, a compound having a molecular weight of less than 1,000 and including two or more functional groups may be used. In this case, the molecular weight may refer to a weight average molecular weight or a conventional molecular weight. A ring structure included in the multifunctional active energy ray polymerizable compound may be any one of a carbocyclic structure, a heterocyclic structure, a monocyclic structure or a polycyclic structure.

In an exemplary embodiment, the composition may include 50 to 90 parts by weight of the polymer derived from butylene, 5 to 35 parts by weight of the compound satisfying Formula 1, and 5 to 25 parts by weight of the multifunctional active energy ray polymerizable compound of Formula 2. In an exemplary embodiment, the pressure-sensitive adhesive composition may include the polymer derived from butylene, the compound satisfying Formula 1 and the multifunctional active energy ray polymerizable compound of Formula 2 in a weight ratio of 50 to 85 parts by weight, 5 to 30 parts by weight and 10 to 25 parts by weight; or 60 to 85 parts by weight, 10 to 30 parts by weight and 2 to 20 parts by weight, respectively. In the present application, as the contents of the components are adjusted in the above ranges, an excellent moisture blocking property and heat retention under a high-temperature and high-humidity condition may be realized.

In an exemplary embodiment, the pressure-sensitive adhesive layer may further include a tackifier, which is preferably a hydrogenated cyclic olefin-based polymer. As the tackifier, for example, a hydrogenated petroleum resin obtained by hydrogenating a petroleum resin may be used. The hydrogenated petroleum resin may be partially or completely hydrogenated, or a mixture of such resins may be used. For the tackifier, one having a high compatibility with a pressure-sensitive adhesive composition, an excellent moisture blocking property, and a low content of an organic volatile component may be selected. As a specific example of the hydrogenated petroleum resin, a hydrogenated terpene-based resin, a hydrogenated ester-based resin or a hydrogenated dicyclopentadiene-based resin may be used. A weight average molecular weight of the tackifier may be about 200 to 5,000. The content of the tackifier may be suitably adjusted as necessary. For example, a content of the tackifier may be selected by considering the compatibility with a polymer, and according to an example, based on 100 parts by weight of the polymer, the tackifier may be included at 5 to 100 parts by weight, 8 to 95 parts by weight, 10 to 93 parts by weight or 15 to 90 parts by weight.

In an exemplary embodiment of the present application, the pressure-sensitive adhesive layer may further include a radical initiator capable of inducing the polymerization reaction of the above-described active energy ray polymerizable compound. The radical initiator may be a photoinitiator or a thermal initiator. A specific type of the photoinitiator may be suitably selected by considering a curing rate and yellowing probability. For example, a benzoin-based, hydroxyketone-based, aminoketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone] or 2,4,6-trimethylbenzoyl-diphenyl-phosphineoxide may be used.

The radical initiator may be included at 0.2 to 20 parts by weight, 0.5 to 18 parts by weight, 1 to 15 parts by weight, or 2 to 13 parts by weight with respect to 100 parts by weight of the active energy ray polymerizable compound. Therefore, a reaction of the active energy ray polymerizable compound may be effectively induced, and degradation of the physical properties of the pressure-sensitive adhesive composition due to a component remaining after curing may be prevented.

The pressure-sensitive adhesive layer may further include a moisture scavenger when needed. The term "moisture scavenger" may refer to, for example, a material capable of removing moisture or vapor permeated into an encapsulation film that will be described later by a chemical reaction therewith. Specifically, the pressure-sensitive adhesive composition may be applied to encapsulate an OED, when formed in a film.

For example, the moisture scavenger may be present in a uniformly dispersed state in the pressure-sensitive adhesive composition or a pressure-sensitive adhesive layer that will be described later. Here, the uniformly dispersed state may mean a state in which the moisture scavenger is present even in any part of the pressure-sensitive adhesive composition or the pressure-sensitive adhesive layer at the same or substantially the same density. As the moisture scavenger, for example, a metal oxide, a sulfate or an organic metal oxide may be used. Specifically, as an example of the sulfate, magnesium sulfate, sodium sulfate or nickel sulfate may be used, and as an example of the organic metal oxide, aluminum oxide octylate may be used. Here, a specific example of the metal oxide may be phosphorous pentoxide ($P_2O_5$), lithium oxide ($Li_2O$), sodium oxide ($Na_2O$), barium oxide (BaO), calcium oxide (CaO) or magnesium oxide (MgO), and an example of the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), or a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchloride ($Ba(ClO_4)_2$) or magnesium perchloride ($Mg(ClO_4)_2$), but the present application is not limited thereto. As the moisture scavenger that can be included in the pressure-sensitive adhesive composition, one or two or more of the above-described components may be used. In an exemplary embodiment, when the two or more of the above-described components are used as the moisture scavenger, calcined dolomite may be used.

Such a moisture scavenger may be controlled in a suitable size according to use. In an exemplary embodiment, an average particle size of the moisture scavenger may be controlled to about 10 to 15000 nm. The moisture scavenger having a size in the above range may be easily stored since a reaction speed of the moisture scavenger with moisture is not so fast, and effectively remove moisture without damage to an element to be encapsulated.

A content of the moisture scavenger may be suitably selected by considering a desired blocking property without particular limitation.

The pressure-sensitive adhesive layer may also include a moisture blocker when needed. The term "moisture blocker" used herein may mean a material that has no reactivity with moisture or can prevent or interfere with the movement of moisture or vapor in a film. As the moisture blocker, one or two or more of clay, talc, needle-like silica, plate-like silica, porous silica, zeolite, titania and zirconia may be used. Also, a surface of the moisture blocker may be treated with an organic modifier to facilitate penetration of an organic material. Such an organic modifier may be, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof.

A content of the moisture blocker may be suitably selected by considering a desired blocking property without particular limitation.

In addition to the above-described components, various additives may be included in the pressure-sensitive adhesive layer according to its use and process of manufacturing an encapsulation film that will be described later. For example, the pressure-sensitive adhesive composition may include a curable material, a crosslinking agent, or a filler in a suitable range of content according to a desired physical property.

Meanwhile, since the encapsulation film is applied in encapsulating an organic electronic element, a content of the moisture scavenger may be controlled by considering a damage to the element. For example, a small amount or none of the moisture scavenger may be applied to the second layer in contact with the element. In one exemplary embodiment, the second layer in contact with the element may include 0 to 20% of the moisture scavenger with respect to the total mass of the moisture scavenger contained in the encapsulation film. Also, the first layer that is not in contact with the element may include 80 to 100% of the moisture scavenger with respect to the total mass of the moisture scavenger contained in the encapsulation film.

A sequence of stacking the first layer and the second layer is not particularly limited, and thus the second layer may be formed on the first layer, or on the contrary, the first layer may be formed on the second layer. Also, the encapsulation film may be formed in three or more layers. For example, two or more of the first layers may be included, or two or more of the second layers may be included.

Also, while formed to a thickness of 100 μm, the pressure-sensitive adhesive layer of the encapsulation film according to the present application may have a water vapor transmission rate (WVTR) of 50, 40, 30, 20 or 10 $g/m^2 \cdot day$ or less, which is measured in a thickness direction of the film at 100° F. and a relative humidity of 100%. As the composition or crosslinking condition of the pressure-sensitive adhesive are adjusted to have such a WVTR, when the pressure-sensitive adhesive is applied to the encapsulation or capsulation structure of the electronic device, the encapsulation or capsulation structure may effectively block moisture or oxygen permeated from the outside and thus stably protect the element. As the WVTR is lower, a more excellent moisture blocking property may be exhibited, and therefore, the lower limit may be, but is not particularly limited to, for example, 0 $g/m^2 \cdot day$.

The metal layer according to an exemplary embodiment of the present application may be transparent or opaque. The metal layer may be formed by depositing metal on a thin metal foil or a polymer base film. For the metal layer, any material having thermal conductivity and a moisture blocking property may be used without limitation. The metal layer may include any one of a metal, a metal oxide, a metal nitride, a metal carbide, a metal oxynitride, a metal oxyboride, and a blend thereof. For example, the metal layer may include an alloy of two or more metals, for example, an iron-nickel alloy. Also, in an exemplary embodiment, the metal layer may include a metal oxide such as silicon oxide, aluminum oxide, titanium oxide, indium oxide, tin oxide, tin indium oxide, tantalum oxide, zirconium oxide, niobium oxide or a blend thereof. The metal layer may be deposited using a means for electrolysis, rolling, heated evaporation, electron beam evaporation, sputtering, reactive sputtering, chemical vapor deposition, plasma chemical vapor deposition or electron cyclotron resonance plasma source chemical vapor deposition. In one exemplary embodiment of the present application, the metal layer may be deposited by reactive sputtering.

Preferably, the metal layer may have a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. Due to the high thermal conductivity, heat generated at a laminating interface in a process of laminating the metal layer may be more rapidly emitted. Also, because of the high thermal conductivity, heat accumulated in the operation of the OED may be quickly emitted to an outside, and thus a temperature of the OED itself may be maintained lower, and cracks and defects may be reduced.

The term "thermal conductivity" used herein may be a degree of the ability to transfer heat by conduction, and the unit may be W/mK. The unit is a degree of heat transmission of a material at the same temperature and distance, and refers to the unit (watt) of heat with respect to the unit (meter) of a distance and the unit (kelvin) of a temperature.

In one example, the pressure-sensitive adhesive layer of the encapsulation film of the present application may have a Mooney viscosity ($\eta^*$) of 5000 to $10^7$ Pa·s measured by a shear stress using a planar jig having a diameter of 8 mm at a strain of 5%, a frequency of 1 Hz and any one temperature point in the range of 30 to 150° C. The Mooney viscosity may be measured by a known method, for example, an ARES (TA). The range of the viscosity may be, for example, 5,000 to $10^7$ Pa·s, 5,000 to $10^6$ Pa·s or 5,000 to $5\times10^5$ Pa·s.

The encapsulation film may further include a base film or release film (hereinafter, probably referred to as a "first film"), and have a structure in which the pressure-sensitive adhesive is formed on the base or release film. Also, the structure may further include a base or release film formed on the pressure-sensitive adhesive (hereinafter, also referred to as a "second film").

FIGS. 1 and 2 are cross-sectional views of an encapsulation film according to an exemplary embodiment of the present application.

As shown in FIG. 1, the encapsulation film of the present application may include a pressure-sensitive adhesive layer 12 and a metal layer 13, which are formed on a base film or release film 11. Also, FIG. 2 shows the pressure-sensitive adhesive layer 12 including a first layer 12a and a second layer 12b.

A specific type of the first film capable of being used in the present application is not particularly limited. In the present application, as the first film, for example, a general polymer film used in the art may be used. In the present application, for example, as the base or release film, a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film may be used. Also, one or both surfaces of the base film or release film of the present application may be treated with a suitable releasing treatment. As an example of a releasing agent used for the releasing treatment of the base film, an alkyde-, silicone-, fluorine-, unsaturated ester-, polyolefin- or wax-based agent may be used, and for the thermal resistance, an alkyde-, silicone- or fluorine-based releasing agent may be used, but the present application is not limited thereto.

In the present application, the thickness of the base film or release film (the first film) is not particularly limited, and may be suitably selected according to use. For example, in the present application, the thickness of the first film may be about 10 to 500 μm, and preferably about 20 to 200 μm. When the thickness is less than 10 μm, the base film may be easily deformed in the manufacturing process, and when the thickness is more than 500 μm, economic feasibility is reduced.

A thickness of the pressure-sensitive adhesive layer included in the encapsulation film of the present application is not particularly limited, and may be suitably selected according to the following condition by considering the use of the film. The thickness of the pressure-sensitive adhesive layer may be about 5 to 200 μm, and preferably about 5 to 100 μm. When the thickness of the pressure-sensitive adhesive layer is less than 5 μm, a sufficient adhesive property may not be ensured, and a rate of the loss of a moisture blocking ability during the process may be accelerated. When the thickness is more than 200 μm, it is difficult to ensure a processability, a space exposed to the side surface may expand so that the moisture blocking property may be degraded, the thermal resistance may be degraded, and the economic feasibility may be deceased.

The present application also relates to a method of manufacturing an encapsulation film. The method may include molding the pressure-sensitive adhesive layer in a film or sheet shape.

In an exemplary embodiment, the method may include applying a coating solution including a component constituting the above-described pressure-sensitive adhesive layer to a base or release film in a sheet or film shape, and drying the applied coating solution.

The coating solution may be prepared by dissolving or dispersing the component of each pressure-sensitive adhesive layer described above in a suitable solvent. In an exemplary embodiment, the pressure-sensitive adhesive layer may be prepared by dissolving or dispersing the moisture scavenger or filler in a solvent when needed, and mixing the moisture scavenger or filler with an encapsulation resin after grinding.

A type of the solvent used in the preparation of the coating solution is not particularly limited. However, when a dry time of the solvent is too much longer or drying at a high temperature is needed, problems in terms of workability or durability of the encapsulation film may occur, and therefore a solvent having a volatile temperature of 150° C. or less may be used. In consideration of film moldability, a small amount of a solvent having the above range or more of a volatilizing temperature may be mixed. As the solvent, one or two or more of methylethylketone (MEK), acetone, toluene, dimethylformamide (DMF), methylcellosolve (MCS), tetrahydrofuran (THF), xylene and N-methylpyrrolidone (NMP) may be used, but the present application is not limited thereto.

A method of applying the coating solution to the base or release film is not particularly limited, and thus may be, for example, a known coating method such as knife coating, roll coating, spray coating, gravure coating, curtain coating, comma coating or lip coating.

The applied coating solution is dried, the solvent is volatilized, and thus a pressure-sensitive adhesive layer may be formed. The drying may be performed, for example, at 70 to 150° C. for 1 to 10 minutes. The drying condition may be changed by considering the used solvent.

A method of stacking a first layer and a second layer is not particularly limited. For example, the first layer and the second layer, which are formed on respective release films, may be laminated, thereby forming a multi-layered encapsulation film, or the second layer may be formed directly on the first layer and vice versa.

After drying, a metal layer may be formed on the pressure-sensitive adhesive layer. A method of forming the metal layer may be a technique known in the art. For example, the metal layer may be formed of metal foil, or formed by depositing a metal on a polymer base. For example, the metal layer may be formed by electrolysis or rolling.

The present application also relates to an OED. The OED may include a substrate; an organic electronic element formed on the substrate; and an encapsulation film encapsulating entire surfaces, for example, all of the top and side surfaces of the organic electronic element. The encapsulation film may include a pressure-sensitive adhesive layer containing a pressure-sensitive adhesive composition in a crosslinked state. Also, the encapsulation film may further include a metal layer formed on the pressure-sensitive adhesive layer.

Here, the organic electronic element may be, for example, an organic light emitting element.

Also, the present application relates to a method of manufacturing an OED. The OED may be manufactured using, for example, the encapsulation film.

The pressure-sensitive adhesive layer may be formed for a structure exhibiting an excellent moisture blocking property in the OED, and effectively fixing and supporting the substrate and the metal layer.

In addition, the pressure-sensitive adhesive layer may be formed to be stable regardless of a type of the OED, for example, a top emission or bottom emission type.

The term "pressure-sensitive adhesive layer" used herein may be a pressure-sensitive adhesive covering all of the top and side surfaces of the organic electronic element.

FIG. 3 is a schematic diagram of an exemplary OED, in which an organic electronic element is an organic light emitting element.

To manufacture the OED, for example, applying the above-described encapsulation film to the substrate on which the organic electronic element is formed to cover the entire surfaces of the organic electronic element; and curing the encapsulation film may be used.

The term "curing" used herein may refer to preparation of a pressure-sensitive adhesive by crosslinking the pressure-sensitive adhesive composition of the present application through heating or UV irradiation.

In detail, the organic electronic element may be formed by forming a transparent electrode on a glass or polymer film used as a substrate through vacuum deposition or sputtering, forming a light emitting organic material layer, for example, consisting of a hole transport layer, an emitting layer and an electron transport layer on the transparent electrode, and further forming an electrode layer thereon. Subsequently, the pressure-sensitive adhesive layer of the encapsulation film is disposed to cover the entire surfaces of the organic electronic element of the substrate, which has gone through the above-described process.

In an exemplary embodiment, as shown in FIG. 3, a product for encapsulating an OED may be disposed such that the pressure-sensitive adhesive layer 12 of the encapsulation film is disposed to be in contact with an OED 22 and a substrate 21. Also, the metal layer 13 may be disposed on the pressure-sensitive adhesive layer 12.

Effect

The present application provides a pressure-sensitive adhesive composition, which can form a structure for effectively blocking moisture or oxygen entering an OED from the outside and has an excellent heat retention under a high-temperature and high-humidity condition, and an encapsulation film including the same.

EXPLANATION OF REFERENCE NUMERALS

Figure 1:
FIGS. 1 and 2 are cross-sectional views of an encapsulation film according to an exemplary embodiment of the present application.
Figure 2:
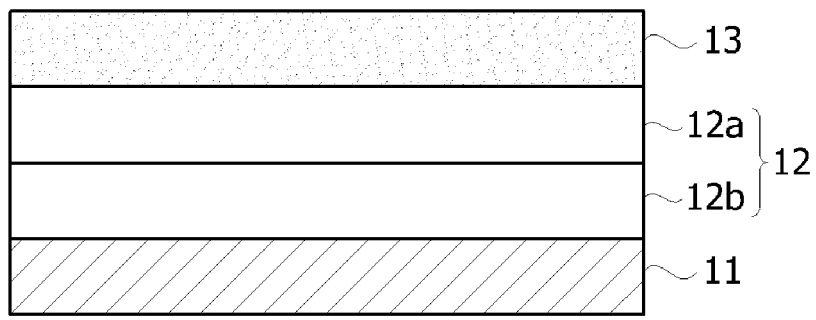
Figure 3:
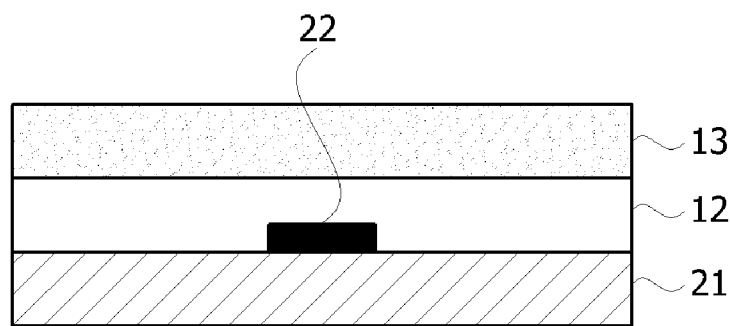
FIG. 3 is a cross-sectional view of an OED according to an exemplary embodiment of the present application.

11: base film or release film
12: pressure-sensitive adhesive layer
12a: first layer
12b: second layer
13: metal layer
21: substrate
22: organic electronic device

DETAILED DESCRIPTION OF EXEMPLARY EMBODIMENTS

Hereinafter, the present application will be described in further detail with reference to examples according to the present application and comparative examples not according to the present application, and the scope of the present application is not limited to the following examples.

Example 1

(1) Preparation of Solution for First Layer

A coating solution was prepared by adding 50 g of butyl rubber (EXXON™ Butyl 068) as a polymer derived from butylene, 35 g of a hydrogenated hydrocarbon resin (EASTOTAC™ H-100 L) as a tackifier, 15 g of trimethylolpropane triacrylate as a multifunctional active energy ray polymerizable compound, and 1 g of 2,2-dimethoxy-1,2-diphenylethane-1-one (IRGACURE® 651, Ciba) as a radical initiator, dispersing calcium oxide added at 50 parts by weight with respect to 100 parts by weight of the total amount of the resin, and diluting the resultant mixture with toluene to have a solid content of about 15 wt %.

(2) Preparation of Solution for Second Layer

A coating solution was prepared by adding 50 g of butyl rubber (EXXON™ Butyl 068) as a polymer derived from butylene, 24 g of a hydrogenated hydrocarbon resin (EASTOTAC™ H-100 L) as a tackifier, 15 g of a monofunctional acrylate, i.e., 2-(2-Ethoxyethoxy)ethyl Acrylate as the compound of Formula 1, 10 g of trimethylolpropane triacrylate as a multifunctional active energy ray polymerizable compound, and 1 g of 2,2-dimethoxy-1,2-diphenylethane-1-one (IRGACURE® 651, Ciba) as a radical initiator, and diluting the resultant mixture with toluene to have a solid content of about 15 wt %.

(3) Formation of Encapsulation Film

An encapsulation film was formed by sequentially stacking a copper film, a first layer and a second layer. Here, the first layer was formed to a thickness of 50 μm by coating a release surface of a release PET with the prepared solution and drying the coated product in an oven at 100° C. for 15 minutes, and the second layer was formed to a thickness of 50 μm by the same method as described above and then laminated with the copper film having a thickness of 20 μm on the first layer. The film sample was irradiated with UV rays at 2 J/cm² to measure physical properties.

Example 2

(1) Preparation of Solution for First Layer

A coating solution was prepared by adding 50 g of butyl rubber (EXXON™ Butyl 068) as a polymer derived from butylene, 40 g of a hydrogenated hydrocarbon resin (EASTOTAC™ H-100 L) as a tackifier, 10 g of trimethylolpropane triacrylate as a multifunctional active energy ray polymerizable compound, and 1 g of 2,2-dimethoxy-1,2-diphenylethane-1-one (IRGACURE® 651, Ciba) as a radical initiator, dispersing calcium oxide added at 50 parts by weight with respect to 100 parts by weight of the total amount of the resin, and diluting the resultant mixture with toluene to have a solid content of about 15 wt %.

(2) Preparation of Solution for Second Layer

A solution for a second layer was prepared by the same method as described in Example 1, except that the compound of Formula 1 was replaced with stearyl acrylate.

(3) Formation of Encapsulation Film

An encapsulation film was formed by the same method as described in Example 1.

Example 3

An encapsulation film was formed by the same method as described in Example 2, except that, in preparation of a solution for a second layer, the compound of Formula 1 was replaced with lauryl acrylate.

Example 4

(1) Preparation of Solution for First Layer

A coating solution was prepared by adding 55 g of butyl rubber (EXXON™ Butyl 068) as a polymer derived from butylene, 40 g of a hydrogenated hydrocarbon resin (EASTOTAC™ H-100 L) as a tackifier, 5 g of trimethylolpropane triacrylate as a multifunctional active energy ray polymerizable compound, and 1 g of 2,2-dimethoxy-1,2-diphenylethane-1-one (IRGACURE® 651, Ciba) as a radical initiator, dispersing calcium oxide added at 50 parts by weight with respect to 100 parts by weight of the total amount of the resin, and diluting the resultant mixture with toluene to have a solid content of about 15 wt %.

(2) Preparation of Solution for Second Layer

A solution for a second layer was prepared by the same method as described in Example 1, except that the compound of Formula 1 was replaced with isodecyl acrylate.

(3) Formation of Encapsulation Film

An encapsulation film was formed by the same method as described in Example 1.

Comparative Example 1

An encapsulation film was formed by the same method as described in Example 1, except that, in preparation of a solution for a second layer, the compound of Formula 1 was not included.

Comparative Example 2

An encapsulation film was formed by the same method as described in Example 1, except that, in preparation of a solution for a second layer, the compound of Formula 1 was replaced with lauryl methacrylate.

Comparative Example 3

An encapsulation film was formed by the same method as described in Example 1, except that a copper film, a second layer and a first layer were sequentially stacked.

Experimental Example 1—Non-Lamination of Panel

A pressure-sensitive adhesive layer having a thickness of 50 μm and a size of 14 cm×9 cm, which was formed in any one of the examples and the comparative examples, was attached to the center of a 0.7 T glass having a size of 150 cm×10 cm using a roll laminator. A glass having the same size as the prepared specimen was laminated (laminated for the second layer to be in contact with the glass) by vertical pressing using a vacuum laminator at 25 to 100° C. and a vacuum degree of 100 pa under a pressure of 0.5 MPa. A laminating property was determined by the degree of non-lamination or bubble generation on the entire surfaces of a pressure-sensitive adhesive, and thus when non-lamination or generation of at least one bubble having a diameter of 3 mm or more occurred, it was determined as a lamination failure.

Experimental Example 2—Creeping Distance

A sample prepared by forming the pressure-sensitive adhesive layer prepared in any one of the examples and the comparative examples on one surface of a metal base having a thickness of 50 μm was attached to a glass at an adhesive area of 1 cm×1 cm, 500 g of a weight was loaded to the metal base in a gravity direction at 85° C. for 1 hour, and then a creeping distance of the pressure-sensitive adhesive layer was measured. The creeping distance was measured for the second layer to be attached to the glass. Here, as the metal base, copper was used. When the weight was loaded, the case in which the adhesive area was all creeped back, the thus the sample was detached was determined as a failure.

Experimental Example 3—Probe Tack Force

A glass having a size of 5 cm×5 cm was prepared, a sample was attached thereto for a layer to be detected among the first or second layer prepared in the examples and the comparative examples to face the outside using a roll laminator, and then a probe tack force was detected on a pressure-sensitive adhesive surface according to ASTM D2979. As equipment for detecting a probe tack force, a ball probe having a diameter of 1 inch, and evaluation was performed under conditions including a contact time of 1 second, a speed of detaching the applied load of 500 gf of 10 mm/sec.

Experimental Example 4—Measurement of Adhesion Between Metal Layer and First Layer An invar metal was prepared, an encapsulation film was attached to be in contact with a first layer using a roll laminator, and then an 1-inch TESA® 07475 tape was attached to a bottom surface of the encapsulation film using a 2 kg roller. Afterward, the encapsulation film was cut in a length direction of the tape, one side of the metal was fixed to an UTM device, and then an adhesive strength required for peeling the tape by pulling at a peel angle of 180° and a peel rate of 300 mm/min.

TABLE 1

|  | Non-lamination of panel | 85° C. retention, creeping distance (μm) | First layer Tack force | Ep(%) | Second layer Tack force | Ep(%) | Adhesion to first layer |
|---|---|---|---|---|---|---|---|
| Example 1 | X | 0 | 120 gf | 47 | 53 gf | 35 | 2300 gf |
| Example 2 | X | 960 | 90 gf | 45 | 5 gf | 30 | 1600 gf |
| Example 3 | X | 500 | 120 gf | 45 | 10 gf | 20 | 2300 gf |
| Example 4 | X | 100 | 200 gf | 34 | 97 gf | 10 | 2700 gf |
| Comparative Example 1 | Lamination failed | Failed | 105 gf | 47 | 105 gf | 43 | 2500 gf |
| Comparative Example 2 | Lamination failed | Failed | 120 gf | 45 | 204 gf | 7 | 2300 gf |
| Comparative Example 3 | X | Failed | 5 gf | 35 | 90 gf | 47 | 60 gf |

What is claimed is:

1. An encapsulation film, comprising:
a metal layer and a pressure-sensitive adhesive layer,
wherein the pressure-sensitive adhesive layer comprises a first layer having an elastic portion calculated by General Equation 1 of 30 to 80%, and a second layer having an elastic portion calculated by General Equation 1 of 8 to 40%, $Ep(\text{unit:}\%) = 100 \times \sigma2/\sigma1$,  [General Equation 1]

where σ1 is the maximum stress value measured when a force of 200 gf at 85° C. is applied in a direction normal to a surface of the film using a plate having a diameter of 8 mm, and positioned parallel to the surface of the film, in a stress relaxation test mode of an advanced rheometric expansion system (ARES) when the pressure-sensitive adhesive layer has a thickness of 600 μm and σ2 is a stress value measured after the force applied to the film has been maintained for 180 seconds.

2. The film of claim 1, wherein the metal layer is directly attached to the first layer.

3. The film of claim 1, wherein the first layer has a probe tack force measured according to ASTM D2979 in a range of 50 to 500 gf.

4. The film of claim 1, wherein the second layer has a probe tack force measured according to ASTM D2979 in a range of 3 to 100 gf.

5. The film of claim 1, wherein the pressure-sensitive adhesive layer comprises a polymer derived from butylene, and a compound satisfying Formula 1:

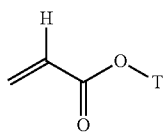

[Formula 1]

where T is a linear or branched alkyl group, alkenyl group or alkynyl group having 6 to 30 carbon atoms, or —U—[O—W]$_n$—O-Q, in which U and W are each independently an alkylene group or alkylidene group, Q is an alkyl group, alkenyl group, alkynyl group or aryl group, and n is a number from 0 to 10.

6. The film of claim 5, wherein the polymer derived from butylene is a homopolymer of a butylene monomer; a copolymer copolymerizing a butylene monomer with a different monomer capable of being polymerized therewith; a reactive oligomer using a butylene monomer; or a mixture thereof.

7. The film of claim 6, wherein the monomer capable of being polymerized with the butylene monomer is isoprene, styrene or butadiene.

8. The film of claim 6, wherein the reactive oligomer using the butylene monomer comprises a butylene polymer having a reactive functional group, and the butylene polymer binds to a different polymer having a reactive functional group.

9. The film of claim 5, wherein the polymer derived from butylene is comprised at 60 to 95 parts by weight, and the compound satisfying Formula 1 is comprised at 5 to 40 parts by weight.

10. The film of claim 5, wherein the pressure-sensitive adhesive layer further includes a multifunctional active energy ray polymerizable compound satisfying Formula 2:

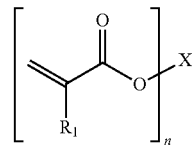

[Formula 2]

where R$_1$ is hydrogen or an alkyl group having 1 to 4 carbon atoms, n is an integer of 2 or higher, and X is a residue derived from a linear, branched or cyclic alkyl group having 3 to 30 carbon atoms.

11. The film of claim 10, wherein the polymer derived from butylene is comprised at 50 to 90 parts by weight, the compound satisfying Formula 1 is comprised at 5 to 35 parts by weight, and the multifunctional active energy ray polymerizable compound of Formula 2 is comprised at 5 to 25 parts by weight.

12. The film of claim 5, wherein the pressure-sensitive adhesive layer further comprises a radical initiator.

13. The composition of claim 12, wherein the radical initiator is a photoinitiator or a thermal initiator.

14. The film of claim 5, wherein the pressure-sensitive adhesive layer further comprises a moisture scavenger.

15. The film of claim 1, wherein the pressure-sensitive adhesive layer further includes a tackifier.

16. The film of claim 15, wherein the tackifier is a hydrogenated cyclic olefin-based polymer.

17. The composition of claim 15, wherein the tackifier is comprised at 5 to 100 parts by weight with respect to 100 parts by weight of the polymer.

18. The film of claim 1, wherein the metal layer has a thermal conductivity of 50 W/mK or more.

19. The film of claim 1, wherein the pressure-sensitive adhesive layer, having a thickness of 100 μm, has a water vapor transmission rate (WVTR) in a thickness direction of 50 g/m$^2$·day or less.

20. An organic electronic device, comprising:
- a substrate;
- an organic electronic element formed on the substrate; and
- the encapsulation film of claim 1, which encapsulates all surfaces of the organic electronic element not in contact with the substrate.

21. A method of manufacturing an organic electronic device, comprising:
- applying the encapsulation film of claim 1 to a substrate on which an organic electronic element is formed to cover all surfaces of the organic electronic element not in contact with a substrate; and
- curing the encapsulation film.

* * * * *